United States Patent [19]
Barany et al.

[11] Patent Number: 5,598,014
[45] Date of Patent: Jan. 28, 1997

[54] HIGH GAIN ULTRAVIOLET PHOTOCONDUCTOR BASED ON WIDE BANDGAP NITRIDES

[75] Inventors: Barbara G. Barany, Falcon Heights; Scott T. Reimer, Fagan; Robert P. Ulmer, Hopkins; J. David Zook, Minneapolis, all of Minn.

[73] Assignee: Honeywell Inc., Minneapolis, Minn.

[21] Appl. No.: 396,314

[22] Filed: Feb. 28, 1995

[51] Int. Cl.$^6$ ................................................. H01L 31/0328
[52] U.S. Cl. ........................ 257/187; 257/201; 257/462; 257/463; 257/464; 250/372
[58] Field of Search ........................... 257/187, 184, 257/201, 431, 448, 439, 457, 459, 462, 463, 464, 465, 441, 185; 250/370.01, 370.12, 372

[56] References Cited

U.S. PATENT DOCUMENTS

| | | | |
|---|---|---|---|
| 4,614,961 | 9/1986 | Khan et al. | 257/453 |
| 4,616,248 | 10/1986 | Khan et al. | 257/22 |
| 5,182,670 | 1/1993 | Khan et al. | 257/22 |
| 5,278,435 | 1/1994 | Van Hove et al. | 257/201 |

OTHER PUBLICATIONS

Murakami et al., "Growth of Si-doped AlxGa1-xN on (0001) sapphire substrate by metalorganic vapor phase epitaxy", Journal of Crystal Growth 115, 648–651.
Nakamura et al., "Si-and Ge-doped GaN films grown with GaN buffer layers", Jap. J. Appl. Phys. vol. 31, 2883–2888.
Khan et al., "High responsivity photoconductive ultraviolet sensors based on insulating single-crystal GaN epilayers", Appl. Phys. Lett. vol. 60, No. 23, 2917–2919.

Primary Examiner—Minhloan Tran
Attorney, Agent, or Firm—Edward L. Schwarz

[57] ABSTRACT

A photoconductor has an active layer of gallium nitride having approximately $10^{15}$ to $5\times10^{15}$ net donor sites per cubic centimeter and is sensitive to UV radiation. This photoconductor has at least one of a sheet resistance in the approximate range of $10^4$ to $5\times10^6$ ohms/unit area and a relatively low level of photoluminescence in the range from about 430–450 nm when excited with light of energy higher than the bandgap energy of 3.4 eV. These criteria tend to define similar semiconductor materials which can form the active layer of an ultraviolet (UV) photodetector having the improved characteristics of a relatively low dark resistance, high sensitivity over at least a range of UV radiation intensity, and decreasing gain with increasing UV radiation.

19 Claims, 3 Drawing Sheets

HIGH GAIN ULTRAVIOLET PHOTOCONDUCTOR BASED ON WIDE BANDGAP NITRIDES

BACKGROUND OF THE INVENTION

Burner controllers such as are used in furnaces and boilers must detect the presence of flame within the combustion chamber. There are a number of different flame characteristics on which the operation of flame detectors are based. One class detects the flickering infrared (IR) radiation generated by the flame. Another class senses the presence of the ionized particles which a flame produces. A third type senses the ultraviolet radiation which an active flame produces. It is possible to imagine situations where ion particle or IR flicker may occur without an active flame. Many experts believe that ultraviolet sensing is the most reliable of these sensors since only an active flame produces enough heat to generate ultraviolet (UV) radiation. The present invention is an improved UV flame detector.

A number of different types of ultraviolet radiation detectors have been used. Historically, the first of these were photomultiplier tubes. These have the disadvantages of requiring relatively high operating voltage, having a relatively small signal current, and having a relatively limited lifetime. There have therefore been attempts to replace these tube detectors with solid state devices.

A number of different solid state UV radiation detectors have been developed and used over the last few decades. One such type uses a cadmium sulfide material as the active element. These also require relatively high voltages and have relatively small signal currents. More recent devices using a UV-enhanced silicon semiconductor material as the active element have substantial sensitivity in the visible light spectrum, and hence require a filter which attenuates the visible light component of the radiation. These have relatively high resistance when exposed to UV radiation. As a general principle, sensors having relatively low internal resistance are preferred, other things like sensitivity and longevity being equal. The lower the internal resistance, the higher the signal current for a given bias voltage. Higher signal current reduces the effect of noise and interference on the signal, allowing for simpler and cheaper leads and less complex amplifiers.

U.S. Pat. No. 5,278,435 discloses a semiconductor device having an active layer comprising GaN material and which exhibits linear response to UV radiation.

The MOCVD (metal organic chemical vapor deposition) process is another technical factor relating to this invention. The MOCVD process has for many years been standard for producing the active elements for various types of electronic devices. The MOCVD process allows one to deposit layers of metallic or semiconductor compounds on a heated substrate placed within a deposition chamber. It involves entraining an organic compound of one or more metals in a first hydrogen stream. A compound of nitrogen or other Group III element is entrained in a second hydrogen stream. The two hydrogen streams with their entrained materials flow through the deposition chamber, where the metallic and Group III materials deposit themselves on the heated substrate. By selecting the entrained elements, temperature, pressure, duration, flow rate, and types of layers created, it is possible to make a variety of solid state semiconductor devices. For the following description, we assume the reader to be familiar with *Organometallic Vapor-Phase Epitaxy: Theory and Practice*, Gerald Stringfellow, Academic Press, Inc. 1989.

BRIEF DESCRIPTION OF THE INVENTION

A UV photoconductor sensor in one embodiment has an active layer comprising gallium nitride in which are a number of electron donor sites and a smaller number of electron acceptor sites. The difference between the number of donor sites and the number of acceptor sites is approximately $10^{15}$ to $5 \times 10^{16}$ per cubic centimeter. This photoconductor sensor has a photoconductive gain substantially greater than one near a relatively low UV illumination of the active layer which decreases with increasing UV illumination.

In a related embodiment a UV photoconductor has an active layer mainly comprising gallium nitride, and has an effective sheet resistance in the approximate range of $10^4$ to $5 \times 10^6$ ohms/square after a short period without UV illumination. This photoconductor also has a photoconductive gain substantially greater than one near the lowest detectable UV illumination of the active layer and which decreases with increasing UV illumination.

Another version of this UV photoconductor has an active layer mainly comprising gallium nitride deposited on a deposition surface and having a first surface in contact with the substrate and a second surface facing away from the substrate and for accepting incident UV radiation. The active layer has within itself and adjacent to the second surface, a depletion region in which is present a reduced concentration of carriers, and spaced from each surface, a conduction channel in which is present an increased concentration of charge carriers. The depletion region decreases in thickness responsive to increasing UV illumination on the second surface. The active layer has a photoconductive gain substantially greater than one at a low level of UV illumination of the active layer and decreases with increasing UV illumination.

DESCRIPTION OF THE PREFERRED EMBODIMENTS

Figure 1:
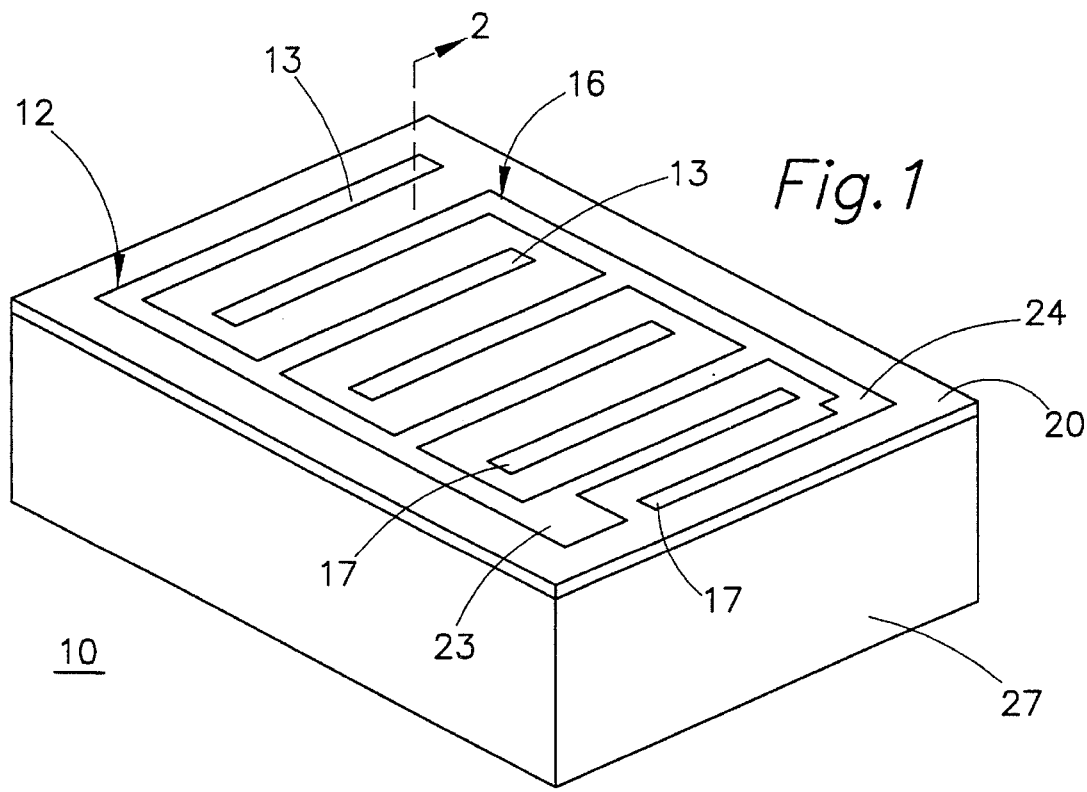
FIG. 1 is a perspective view of a UV photoconductor sensor in which the invention is embodied.

FIG. 1 discloses a preferred arrangement for a UV photoconductor sensor 10 having a source electrode 12 and a drain electrode 16 lying on the surface of an N-type semiconductor active layer 20 of photoconductor sensor 10. UV radiation directed onto the top surface of active layer 20 reduces the electrical resistance of active layer 20 by a factor of 4 or more, and elements to be described shortly allow this resistance change to be detected. A substrate 27, typically formed of sapphire, supports active layer 20, with an intermediate layer 22, typically of aluminum nitride, not shown in FIG. 1, interposed between active layer 20 and substrate 27. Intermediate layer 22 is necessary for active layer 20 to have the desired characteristic of selective and high sensitivity in the UV spectral band of wavelengths in the approximate range of 200 to 365 nm.

Active layer 20 comprises mostly gallium nitride although there may be fractional concentrations of aluminum nitride and indium nitride therein for controlling spectral response. Hereafter, we will refer to gallium nitride as the constituent of active layer 20, but the reader should understand that there may be detectable fractions of both indium nitride and aluminum nitride in active layer 20.

We prefer to deposit both the intermediate layer 22 and the active layer 20 using the MOCVD process mentioned above, and it is this process that has been used to produce the functional devices 10 we have made so far. For the most part we use standard MOCVD deposition practices. For our version of the process however, we have found that specific ranges for these parameters produce active layers 20 with the appropriate electrical characteristics. These specific ranges will be specified in the details of the process which we describe below. As is conventional for producing active layers using the MOCVD process, a sapphire wafer having space on its deposition for hundreds of individual sensors is coated with the active layer, and then as a later step in the process, sawed into individual sensors. This is an entirely conventional aspect of our process.

The change in resistivity of active layer 20 is detected by sensing the resistance between a source electrode 12 and a drain electrode 16, which comprise the metallization, i.e., surface electrical conductor elements, for this device. Source electrode 12 has a series of spaced apart parallel fingers 13. Drain electrode 16 has a plurality of spaced apart fingers 17 interleaved with, spaced apart from, and parallel to the fingers 13 of electrode 12 as shown in FIG. 1. The pattern shown for electrodes 12 and 16 in FIG. 1 is far from true scale because of the very small dimensions involved. In one preferred embodiment, each finger 13 and 17 may be approximately 40 μm wide, 900 μm long, 0.46 μm thick, and spaced from its adjoining finger(s) 13 or 17 by 80 μm. Each electrode has 4 fingers 13 or 17 as shown.

Figure 2:
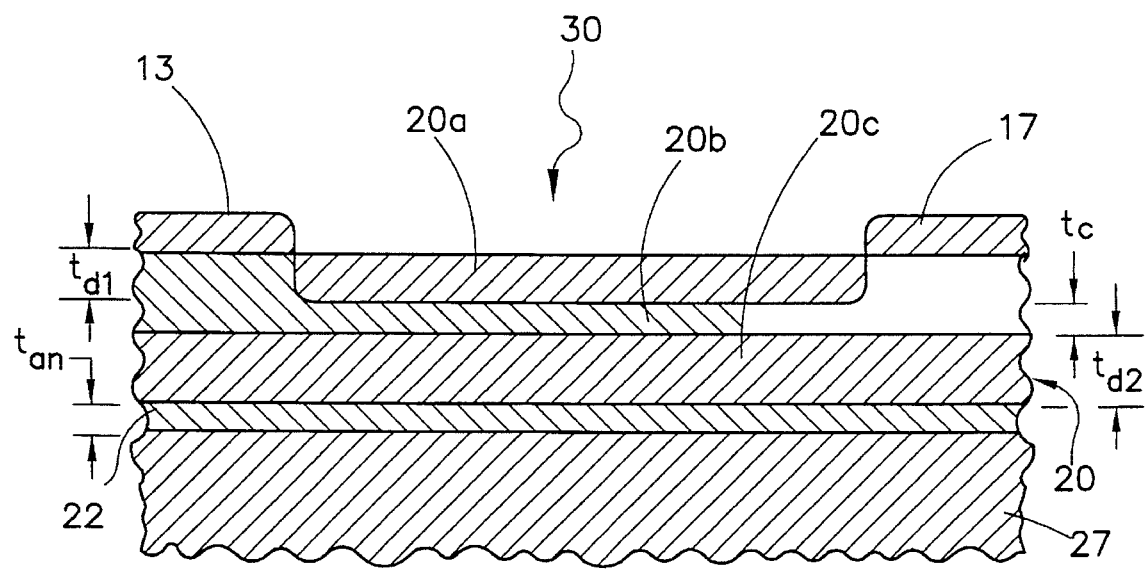
FIG. 2 is a cross sectional view of a portion of the sensor of FIG. 1, in which we show its electrical structure.

FIG. 2 is a cross section of sensor 10 in the vicinity of a finger 13 and a finger 17 as indicated by the cross section arrow of FIG. 1. One can see a part of the individual fingers 13 and 17 sitting atop the active layer 20 and making ohmic contact therewith. Active layer 20 is shown as having three individual sublayers or regions which we refer to hereafter as a variable depletion region 20a, a conduction channel 20b, and a fixed depletion region 20c. These three regions have effective thickness dimensions respectively of $t_{d1}$, $t_c$, and $t_{d2}$. Depletion regions 20a and 20c have a deficiency of current carriers, i.e. donor sites, and thus have a relatively high intrinsic resistance. Conduction channel 20b has an excess of donor sites and thus has a relatively low resistance. Active layer 20 is designed so that over its entire volume there is an average of approximately $10^{15}$ to $5\times10^{16}$ donor sites in excess of acceptor sites per cc., or 13 to 650 donor sites in excess of acceptor sites per $10^9$ gallium or other metal atoms. The absence of donor sites in depletion regions 20a and 20c is a boundary or surface effect in layer 20, occurring near its two surfaces.

We theorize that incident UV radiation symbolized by the wiggly arrow 30 affects conduction characteristics of active layer 20 by altering the relative thicknesses $t_{d1}$ and $t_c$ of depletion region 20a and conduction channel 20b. The thickness of depletion region 20c is relatively constant because UV radiation cannot penetrate volume 20a and channel 20b to reach depletion volume 20c to alter its conduction characteristic. When incident UV radiation intensity is relatively low, $t_c$ is small relative to $t_{d1}$ and because the highly conductive cross sectional area of conduction channel 20b is relatively small, resistance between fingers 13 and 17 is large. When incident UV radiation intensity is relatively large, $t_c$ actually changes quantitatively, becoming much larger relative to $t_{d1}$ and increasing the cross sectional area of conduction channel 20b. The larger area of conduction channel 20 decreases the resistance between fingers 13 and 17. This change in resistance is significant, typically at least a factor of 4 or more, and can easily be detected by conventional electrical circuitry. Incident UV radiation intensity can be measured in at least two different ways, photons per unit area per second, and watts per unit area. These measures of radiation intensity are interchangeable.

The reader should realize that the representation in FIG. 2 of the depletion regions 20a and 20c is idealized. It is certain that the actual transitions from depletion regions 20a and 20c to conduction channel 20b are not nearly as well defined as shown in FIG. 2. It is possible that there is a gradient over perhaps several percent of the total thickness of active layer 20, in the concentration of donor sites from the lowest in each of the depletion regions 20a and 20c to the highest in the conduction channel 20b. The actual shape of regions 20a and 20c and channel 20b is also idealized in FIG. 2. It is likely that these shapes are not as rectangular as shown. What the actual shapes are though is not easy to predict at this time. At any rate, the quantitative values of these dimensions may be considered equivalent for the heuristic purposes intended here.

Figure 3:
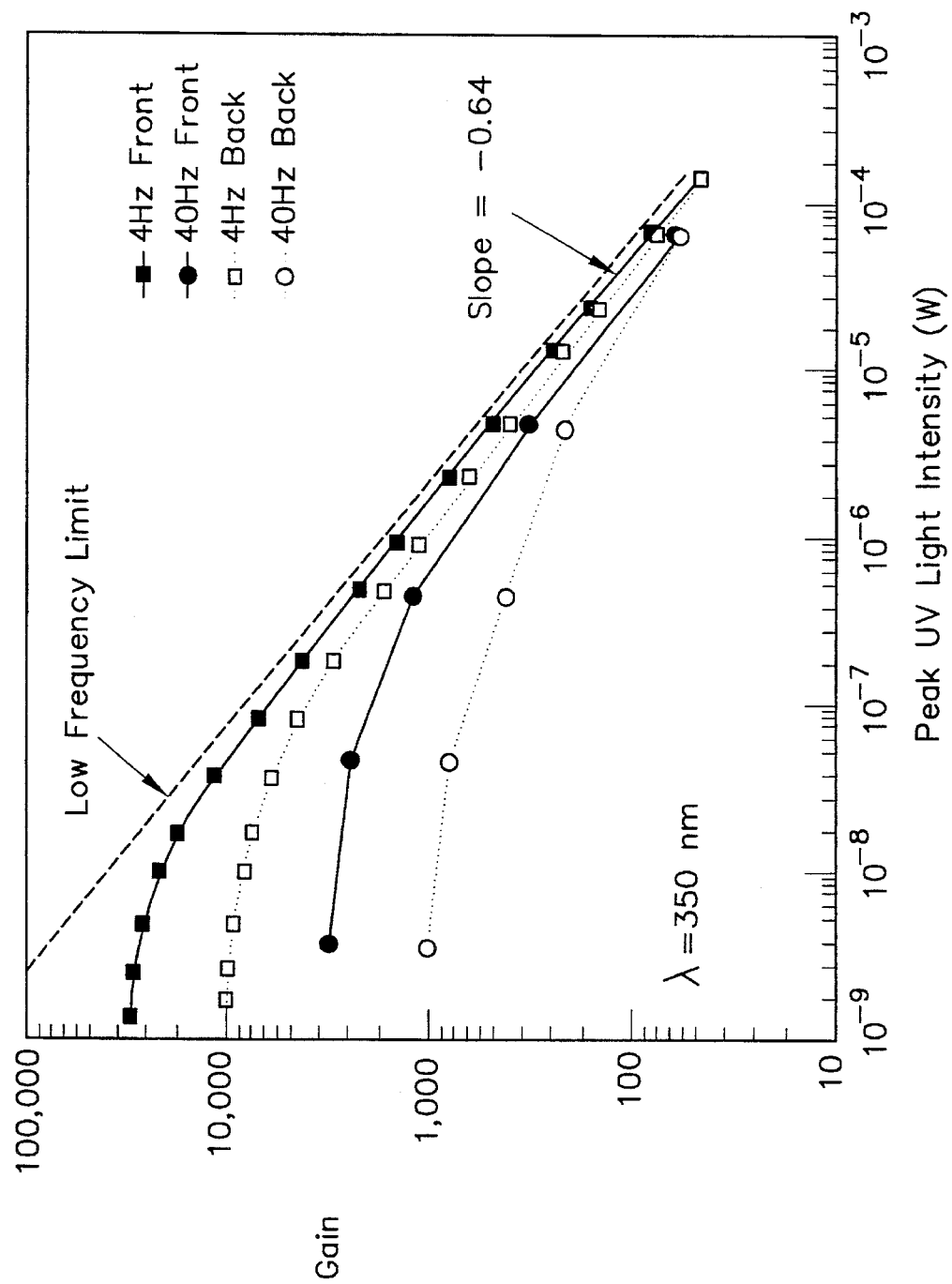
FIG. 3 is a graph showing photoconductive gain of the sensor as a function of UV light intensity.

Furthermore, the resistance change occurring for a preselected change in incident UV radiation when the present UV radiation level is small, is much greater percentagewise than when the present UV radiation is relatively large. This decreasing sensitivity to changes in UV radiation intensity as a function of increasing UV radiation intensity is shown in FIG. 3, which is a plot of gain for a typical sensor 10 versus incident UV radiation intensity. One can see that near the lowest appreciable level of UV radiation, a small change in the level of UV radiation causes a relatively large change in current flow. As UV radiation intensity increases, the change in current flow becomes increasingly smaller percentagewise.

Silicon is well known as one element which provides donor sites in gallium nitride and other nitride semiconductors. In a currently preferred embodiment of this sensor 10 we have a substantially uniform concentration of silicon atoms of approximately $10^{15}$ to $8\times10^{16}$ throughout the active layer 20, which is sufficient to create a donor site in excess of acceptor site concentration of $10^{15}$ to $5\times10^{16}$ per cc. In another possible form of active layer 20, a relatively high concentration of silicon atoms is provided in the center of the thickness of active layer 20, within the conduction channel 20b to form the required donor sites. This concentration of silicon atoms is created by appropriately modifying the deposition step which forms active layer 20. An appropriate average concentration of silicon atoms is $10^{17}$ to $5\times10^{18}$ per cc within a centrally located narrow layer in active layer 20. The layer may be no thicker than 1 to 100 nm, and is created during the growth of conduction channel 20b, by briefly altering the composition of the gasses from which active layer 20 is deposited. Although silicon has been found to provide suitable results for providing donor sites, other materials may also be as suitable or even better.

We have previously mentioned that smaller amounts of aluminum and indium can be included as constituents of active layer 20 to achieve certain desirable characteristics in spectral response. One tendency noted in some samples of sensor 10 having the previously described structure, is sharply reduced gain at temperatures at and below approximately −40° C. We believe, based on experience and analysis, that including dopants comprising germanium, sulphur, selenium, and tin in active layer 20 instead of silicon may reduce this tendency substantially. Accordingly, active layers 20 having such dopants comprising germanium, sulphur, selenium, and tin form a part of our invention. Appropriate uniform concentrations here too are from $10^{15}$ to $8 \times 10^{16}$ atoms per cc within active layer 20.

FIG. 3 is a representative graph showing the relationship between gain and UV light intensity. The gain values on the ordinate are the actual number of electrons which flow to form the signal current due to a certain bias voltage between electrodes 12 and 16, and responsive to a single photon of the specified wavelength impinging on the active layer 20. One can see that gain tends to uniformly decrease with increasing UV light intensity. The values at very low levels of light intensity may not exhibit this decreasing gain characteristic, so the criterion is strictly true only for UV light intensity above some very low level, perhaps $10^{-9}$ W/mm$^2$. In this test, there were four different tests performed, as shown in the legend. Two were for UV light impinging directly on active layer 20 and two were with the UV light shining through the substrate 27. Note that sapphire is transparent to UV radiation. Two different frequencies were tested as shown, to determine frequency dependency of gain.

Figure 4:
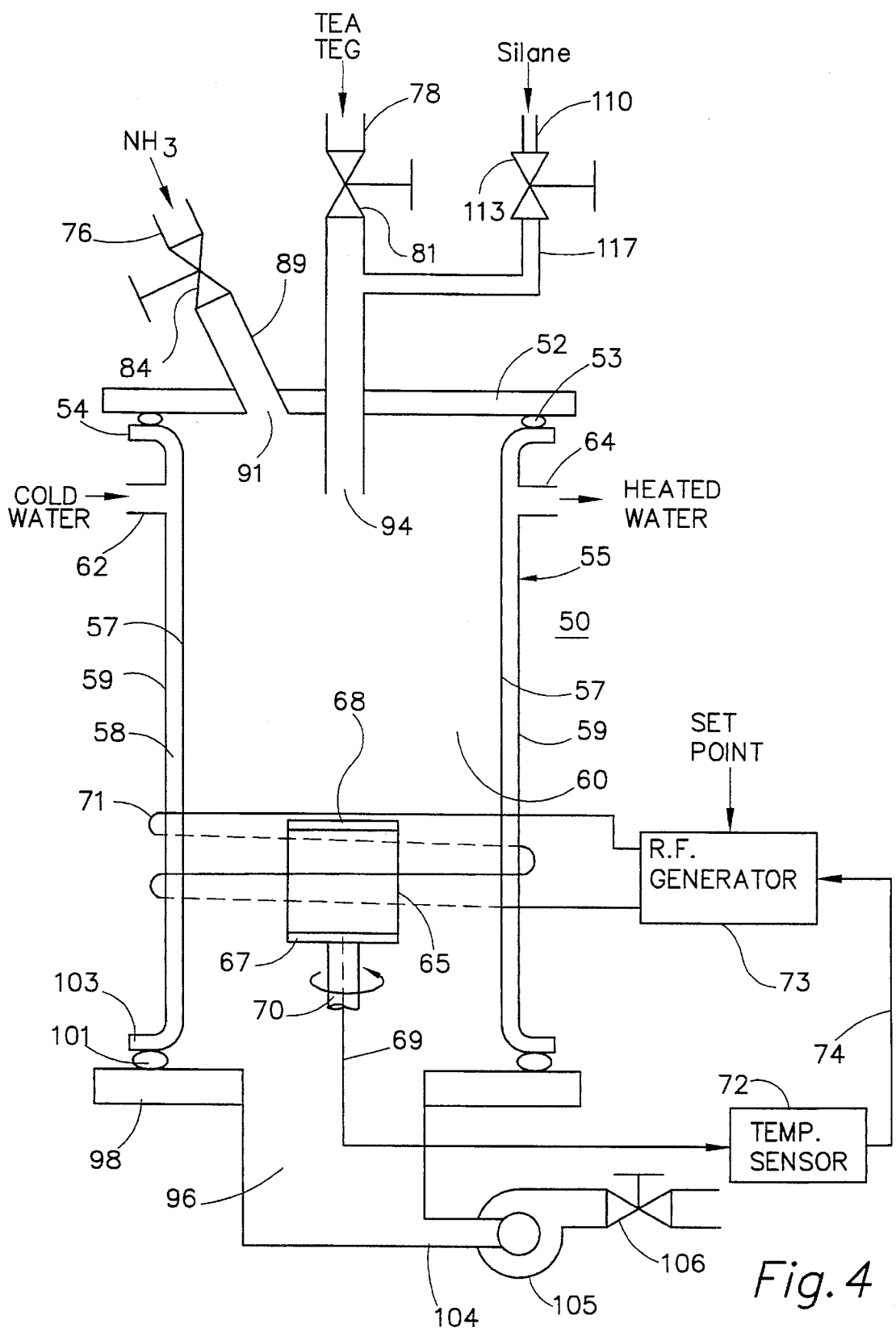
FIG. 4 is an outline diagram of a preferred apparatus for producing the sensor of FIG. 1.

We have developed a version of the MOCVD process for producing photoconductor 10. FIG. 4 is an outline diagram of the MOCVD equipment which we use to deposit the aluminum nitride intermediate layer 30 and the gallium nitride active layer 20. The person with ordinary skill in the art of practicing MOCVD processes knows that such processes are complex, and that their reproducibility and repeatability sometimes depends on factors which cannot be identified or accurately controlled. When components for apparatus such as that of FIG. 4 are first chosen, it is axiomatic that there will be a runup period during which yields will be lower than one expects. As the skilled user gains more experience with the apparatus, yields will increase and the occurrence of bad batches which must be totally discarded will become much less frequent. Furthermore, we have discovered certain parameters which we at the present time find to be critical, and these will all be identified and explained.

The MOCVD deposition apparatus 50 shown in FIG. 4 includes a cylindrical deposition chamber 55 defining an inner volume 60. Chamber 55 has an inner volume 60 defined by an inner wall 57, an inner bottom 74 integral with inner wall 74, and a top cover 52. Top cover 52 is clamped against a flange 54 with an O-ring 53 between them to prevent leaks. Chamber 55 also has an outer wall 59 spaced from inner wall 57. The space formed between inner wall 57 and outer wall 59, and inner bottom 74 and outer bottom 75 defines a cooling jacket 58 through which cooling water can circulate. Cooling water enters jacket 58 from an external source through a cold water inlet 62 and exits jacket 58 through outlet 64 after having been heated to boiling. A bottom plate 98 is clamped against flange 103 of chamber 55 with an O-ring 101 to prevent leakage. In our commercial embodiment the top cover 52 and bottom plate 98 are formed of stainless steel and the remainder of the chamber 55 described to this point is formed of quartz glass.

A pedestal 67 is mounted for rotation within chamber 55 on a shaft 70. A motor not shown, is magnetically connected to shaft 70 so that pedestal 67 can be rotated at any preselected speed. We prefer a rotational speed for shaft 70 of 1 rps for the entire deposition process involved here.

Pedestal 67 supports a susceptor 65 comprising graphite and having a silicon carbide coating. Susceptor 65 is for supporting and heating a wafer 68 which comprises the substrate which receives the intermediate and active layers during the deposition process. Shaft 70, pedestal 67, and susceptor 65 are all centrally located within volume 60 in our embodiment, and we believe that this enhances desirable uniform flow of gasses within volume 60. A temperature sensor 72 has an optical temperature probe 69 which fits through a hollow core in shaft 70 and pedestal 67 with its end adjacent to the bottom surface of susceptor 65 resting on pedestal 67. The temperature sensor 72 receives radiation indicative of the susceptor 65 temperature transmitted by the probe 69, and provides a control signal on a path 74. While this is the most accurate means of sensing temperature of susceptor 65 which we know at the present time, it is not as accurate as we would like. In fact, we believe that a better means of measuring susceptor 65 temperature would enhance the performance of this process.

An external RF coil 71 is wound around the exterior of chamber 55 and powered by a 650 Khz RF generator 73 during deposition steps. In our embodiment, coil 71 has 5 turns rather than the 2 turns shown. By applying RF power to coil 71, it is possible to heat susceptor 65 and a wafer 68 sitting on it, to any temperature suitable for MOCVD processes, and at least 1100° C. A temperature set point value is supplied by the operator to RF generator 73. RF generator 73 also recieves a signal from the temperature sensor 72 which indicates the temperature of susceptor 65. RF generator 73 adjusts its output to coil 71 so as to maintain the susceptor temperature at the set point. In this way, the temperature of wafer 68 can be held to a desired value with resonable accuracy. In the two deposition steps of our process, the temperature of wafer 68 is quite critical; pains should be taken to hold the temperatures specified below with good accuracy.

The gasses in which are entrained the materials to be deposited on wafer 68 are introduced through tubes 86 and 89 in cover 52. Inlet tubes 86 and 89 have a gas-tight mounting in cover 52. A quartz glass inlet portion of tube 86 projects through cover 52 so that its end 94 is below the inner (bottom) surface of cover 52 by an appreciable amount. A supply tube 78 for tri-ethyl gallium (TEG) is connected to inlet tube 86 by a flow control valve 81. A supply tube 76 for ammonia (NH$_3$) is connected to inlet tube 89 by a flow control valve 84. By adjusting valves 81 and 84, the flow rates of TEG and ammonia into volume 60 can be accurately controlled. Ammonia and TEG flow rates appear to be critical process parameters.

Gasses within volume 60 exit through an exhaust port 96 and duct 104. A vacuum pump 105 reduces pressure with chamber 55 to the desired value of 76 torr or less, with a flow control valve 106 setting the actual desired chamber pressure of 76 torr.

It is possible to provide for adding other materials to either the ammonia or the TEG stream as well. For example, there is shown in FIG. 4 a further supply tube 110, in this example for silane entrained in hydrogen gas, is shown. A valve 113 controls the flow of this silane-containing gas stream to an inlet tube 117, by which the silane is introduced into the TEG stream.

The following Process Steps Table defines the operating steps and their order for producing active layers of gallium nitride on wafers 68 suitable for sawing into sensors 10 of the type described after the metallization has been added. The Process Parameters Table defines the parameter values and apparatus dimensions to be used in the process steps. It is not possible to determine for every one of this rather extensive list of parameters, which of the values may turn out to be critical. For example, we have found that the spacing between end 94 of tube 86 and the top of wafer 68 specified below, provides acceptable performance both from the standpoint of product characteristics and of yield. Yet this is not a parameter which is easy to change in an operating system, and there may well be other values which function as well or even better. We strongly recommend that a person wishing to practice this invention should start with the values we provide in order to minimize the time required to optimize the process for his or her particular installation.

There are many other requirements for successfully operating an MOCVD process which are well know to those of skill in the art. These are documented in a number of sources, such as the Stringfellow reference identified above.

PROCESS STEPS TABLE

Clean surface of wafer 68
Allow sufficient water to flow into inlet 62 to maintain wall 57 and bottom 74 near 100° C.
Adjust valve 96 throughout following steps to maintain pressure in volume 60 at 76 torr
Adjust RF generator 73 to hold temperature of susceptor 65 temperature at *750° C. (range 740° to 775° C.) (Critical value—must be held as accurately as possible; the actual optimized value will usually be in the specified range)
For a 10 minute first interval, allow tri-ethyl aluminum (TEA) to flow through valve 81 to maintain a partial pressure of TEA within inlet tube 94 of $2.4\times10^{-3}$ torr and a total flow of gasses through tube 94 of 881 standard cc/min, and ammonia to flow through valve 84 to maintain a partial pressure of ammonia of 0.42 torr within inlet tube 89 and a total flow of gasses through tube 89 of 1942 standard cc/min
Adjust RF generator 73 to raise the temperature of susceptor 65 to 1000° C. (range 1000° to 1050° C.) and hold
For an 80 minute second interval, allow tri-ethyl gallium (TEG) to flow through valve 81 to maintain a partial pressure of TEG within inlet tube 94 of $3\times10^{-2}$ torr and a total flow of gasses through tube 94 of 780 standard cc/min; ammonia to flow through valve 84 to maintain a partial pressure of ammonia of 0.63 torr within inlet tube 89 and a total flow of gasses through tube 89 of 3015 standard cc/min
Either:
  a) During the second interval of 80 min, allow silane or other gas containing other dopant elements to flow through valve 113 and tube 117 to maintain a partial pressure of silane or other gas within tube 94 of $4\times10^{-6}$ torr; (preferred embodiment) or
  b) During a subinterval of from 6 sec to 10 min centered in the second interval of 80 min, allow silane or other gas containing other dopant elements to flow through valve 113 and tube 117 to maintain a partial pressure of silane or other gas within tube 94 of $1.5\times10^{-5}$ torr;
Cool wafer 68 to room temperature, maintaining flow of the ammonia stream until the wafer 68 temperature has fallen to at least 400° C.;
Add metallization patterns as shown in FIG. 1 according to well known photolithographic processes; test individual sensor sites
Saw wafer 68 into individual sensors 10

| PROCESS PARAMETER TABLE | |
| --- | --- |
| Tri-ethyl gallium purity, silicon parts/billion | <30 |
| Volume 60 diameter | 7.0 cm |
| Volume 60 height | 29 cm |
| Susceptor 65 diameter | 5.1 cm |
| Susceptor 65 height | 3.8 cm |
| Distance tube 94 projects into volume 60 | 3.6 cm |
| Inside diameter of tube 94 | 0.3 cm |
| Inside diameter of tube 91 | 0.46 cm |
| Distance between end of tube 94 and top of wafer 68 | 14.48 cm |

We have determined that the amount of silicon in the active layer 20 is critical. It is difficult to maintain the integrity of the process if the silicon content of the TEG is not consistently low and all other potential sources of silicon are sufficiently and consistently low (except for the silane of course). The concentration of silicon in the active layer 20 cannot otherwise be accurately controlled.

The above describes our invention; what we wish to claim is:

1. A UV photoconductor having an active layer comprising gallium nitride, and having a number of electron donor sites and a smaller number of electron acceptor sites, wherein the difference between the number of donor sites and the number of acceptor sites is approximately $10^{15}$ to $5\times10^{16}$ per cubic centimeter, said active layer having a surface for exposure to UV illumination and adjacent to the surface, a depletion region having a first thickness when incident UV illumination on the surface is relatively low, and a second thickness smaller than the first thickness while incident UV illumination on the surface is relatively large.

2. The UV photoconductor of claim 1 wherein the active layer has an effective sheet resistance in the approximate range of $10^4$ to $5\times10^6$ ohms/square after a short period without UV illumination.

3. The UV photoconductor of claim 2 wherein the effective sheet resistance of the active layer has a first value without UV illumination and a second value smaller than the first value by a factor of at least approximately 4 during a period of relatively intense UV illumination after a period without UV illumination.

4. The UV photoconductor of claim 1, wherein at least a substantial fraction of the donor sites in the active layer comprise silicon atoms.

5. The UV photoconductor of claim 4, wherein at least 90% of the donor sites in the active layer comprise silicon atoms.

6. The UV photoconductor of claim 4, wherein the gallium nitride layer has a predetermined thickness and a higher concentration of silicon atoms in the vicinity of the center of the thickness of the active layer.

7. A UV photoconductor having an active layer mainly comprising gallium nitride, said active layer having an effective sheet resistance in the approximate range of $10^4$ to $5\times10^6$ ohms/square after a short period without UV illumination, and said active layer having a surface for exposure to UV illumination and adjacent to the surface, a depletion region having a first thickness in the absence of detectable UV illumination of the surface, and a second thickness smaller than the first thickness while the surface receives UV illumination.

8. The UV photoconductor of claim 7 wherein the effective sheet resistance of the active layer has a first value without UV illumination and a second value smaller than the first value by a factor of at least approximately 4 during a period of relatively intense UV illumination after a period without UV illumination.

9. The UV photoconductor of claim 7, wherein the active layer includes a plurality of electron donor sites of which a substantial fraction comprise silicon atoms.

10. The UV photoconductor of claim 9, wherein at least 90% of the donor sites in the active layer comprise silicon atoms.

11. The UV photoconductor of claim 9, wherein the active layer has a predetermined thickness and a higher concentration of silicon atoms in the vicinity of the center of the thickness of the active layer.

12. A UV photoconductor having an active layer mainly comprising gallium nitride deposited on a surface of a substrate and having a first surface in contact with the deposition surface and a second surface facing away from the deposition surface, at least one of said first and second surfaces for accepting incident UV radiation, said active layer having within itself and adjacent to the second surface, a depletion region in which is present a lesser concentration of charge carriers than in the active layer adjacent to the depletion region, and spaced from each surface, a conduction channel in which is present a greater concentration of charge carriers than in the active layer adjacent to the conduction channel, said depletion region having a first thickness responsive to UV illumination on an active layer surface, and a second thickness greater than the first thickness in the absence of UV illumination of an active layer surface.

13. The UV photoconductor of claim 12, wherein the depletion region and the conduction channel each have a thickness dimension normal to the second surface, wherein the ratio of the depletion region thickness to the conduction channel thickness decreases by a factor of at least approximately 4 during a period of relatively intense UV illumination after a period of relatively low UV illumination.

14. The UV photoconductor of claim 12, wherein the active layer includes at least one of indium gallium nitride, aluminum gallium nitride, and aluminum indium gallium nitride.

15. The UV photoconductor of claim 14 wherein the active layer has a doped region approximately midway between the first and second surfaces thereof in which is a concentration of atoms of at least one element selected from a doping group of silicon, sulphur, tin, tellurium, selenium, and germanium.

16. The UV photoconductor of claim 15, wherein the doped region is approximately 1 to 100 nm thick.

17. The UV photoconductor of claim 15, wherein the concentration of atoms from the doping group is approximately $10^{17}$ to $5 \times 10^{18}$ per cc. in the doped region.

18. The UV photoconductor of claim 12 wherein the active layer has a concentration of atoms of at least one element selected from a doping group of silicon, sulphur, tin, tellurium, selenium, and germanium.

19. The UV photoconductor of claim 18, wherein the concentration of atoms from the doping group is $10^{15}$ to $8 \times 10^{16}$ per cubic centimeter.

* * * * *